(12) United States Patent
Casellato et al.

(10) Patent No.: US 8,860,223 B1
(45) Date of Patent: Oct. 14, 2014

(54) RESISTIVE RANDOM ACCESS MEMORY

(75) Inventors: Cristina Casellato, Sulbiate (IT); Carmela Cupeta, Milan (IT); Michele Magistretti, Gessate (IT); Fabio Pellizzer, Cornate d'Adda (IT); Roberto Somaschini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 12/836,661

(22) Filed: Jul. 15, 2010

(51) Int. Cl.
*H01L 23/532* (2006.01)
*H01L 23/485* (2006.01)
*H01L 27/24* (2006.01)
*H01L 23/528* (2006.01)

(52) U.S. Cl.
CPC ............ *H01L 23/5283* (2013.01); *H01L 27/24* (2013.01); *H01L 23/53295* (2013.01)
USPC .................. 257/760; 257/758; 257/E23.011; 257/E23.145; 257/E27.004

(58) Field of Classification Search
CPC . H01L 23/481; H01L 23/522; H01L 23/5226; H01L 23/528; H01L 23/5283; H01L 23/53204; H01L 23/53209; H01L 23/53271; H01L 23/5329; H01L 23/53295; H01L 27/24; H01L 27/2463; G11C 5/063; G11C 13/0002; G11C 13/0023
USPC ........ 365/148, 63; 257/758, 5, 760, E23.011, 257/E23.142, E23.145, E45.002, E27.004
See application file for complete search history.

(56) References Cited

U.S. PATENT DOCUMENTS

| | | | | |
|---|---|---|---|---|
| 6,037,207 | A * | 3/2000 | Asano et al. | 438/241 |
| 6,399,987 | B2 * | 6/2002 | Kim | 257/340 |
| 6,573,575 | B1 * | 6/2003 | Yamazaki | 257/392 |
| 7,495,275 | B2 * | 2/2009 | Ema | 257/301 |
| 7,518,196 | B2 * | 4/2009 | Chau et al. | 257/401 |
| 7,667,221 | B2 * | 2/2010 | Song et al. | 257/4 |
| 2008/0272355 | A1 * | 11/2008 | Cho et al. | 257/2 |
| 2009/0040802 | A1 * | 2/2009 | Arakawa | 365/51 |
| 2009/0200579 | A1 * | 8/2009 | Morishige | 257/210 |

* cited by examiner

*Primary Examiner* — Allison P Bernstein
(74) *Attorney, Agent, or Firm* — Dorsey & Whitney LLP

(57) ABSTRACT

A resistive random access memory may include a memory array and a periphery around the memory array. Decoders in the periphery may be coupled to address lines in the array by forming a metallization in the periphery and the array at the same time using the same metal deposition. The metallization may form row lines in the array.

9 Claims, 11 Drawing Sheets

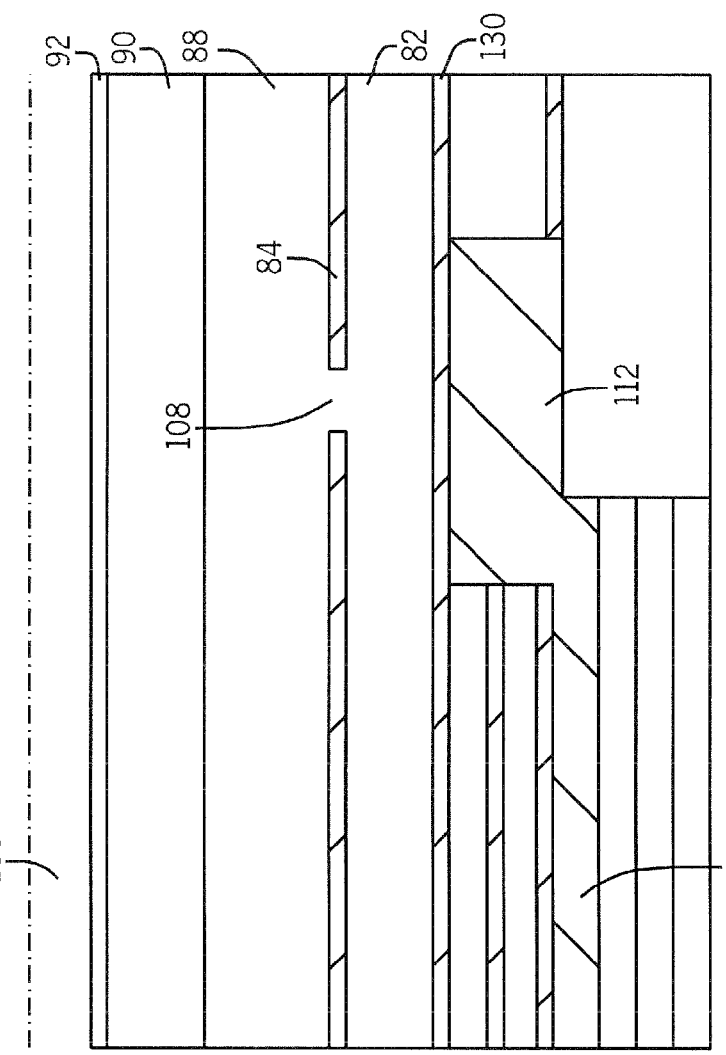
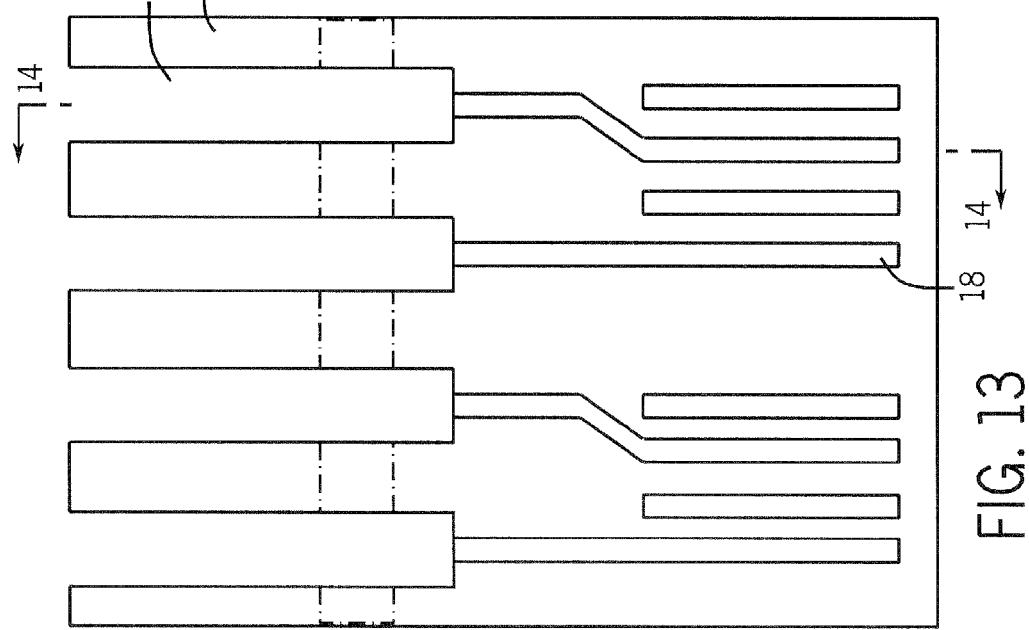

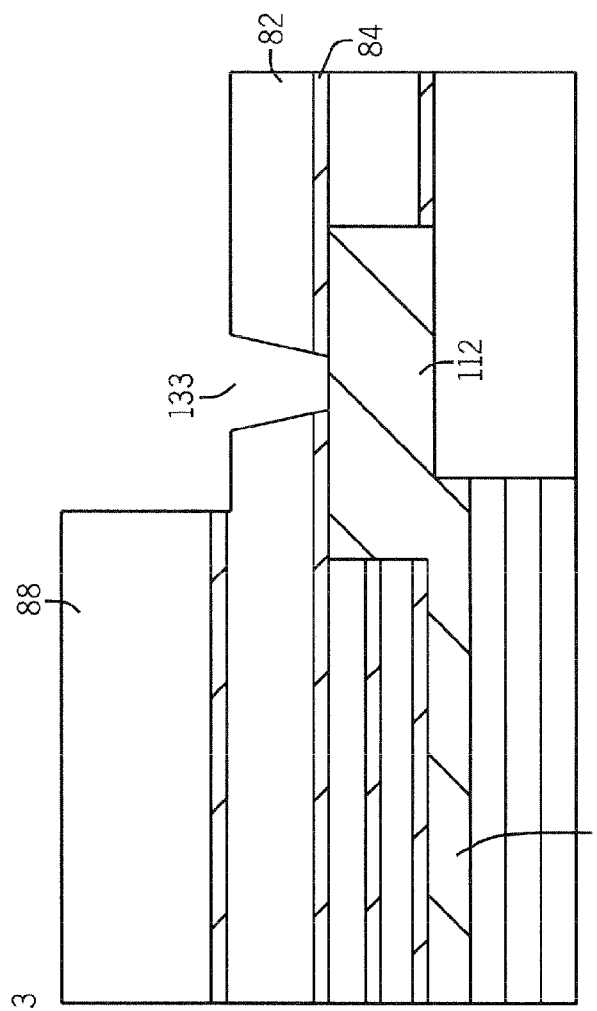
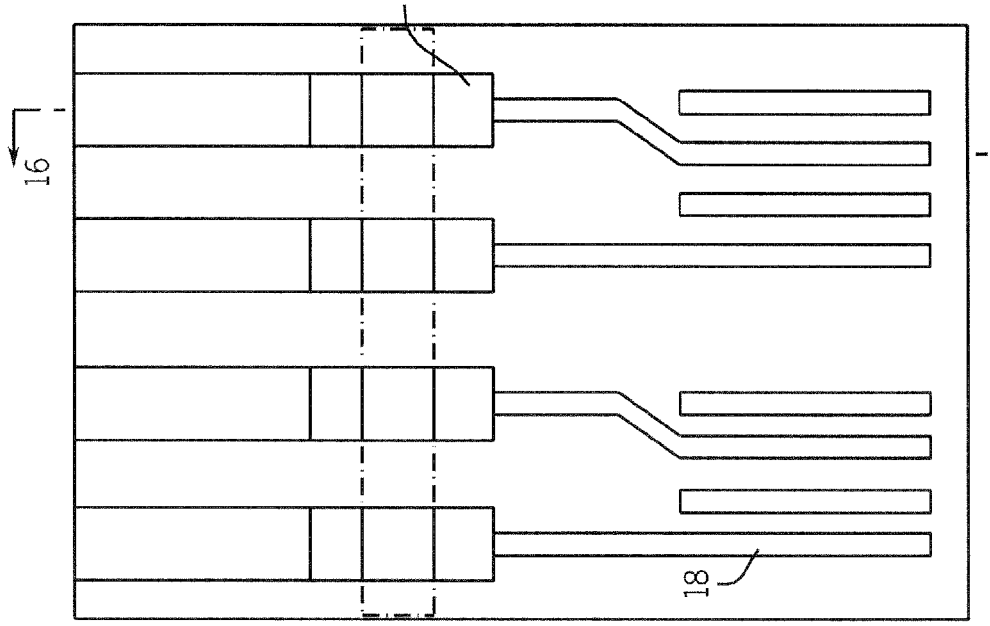

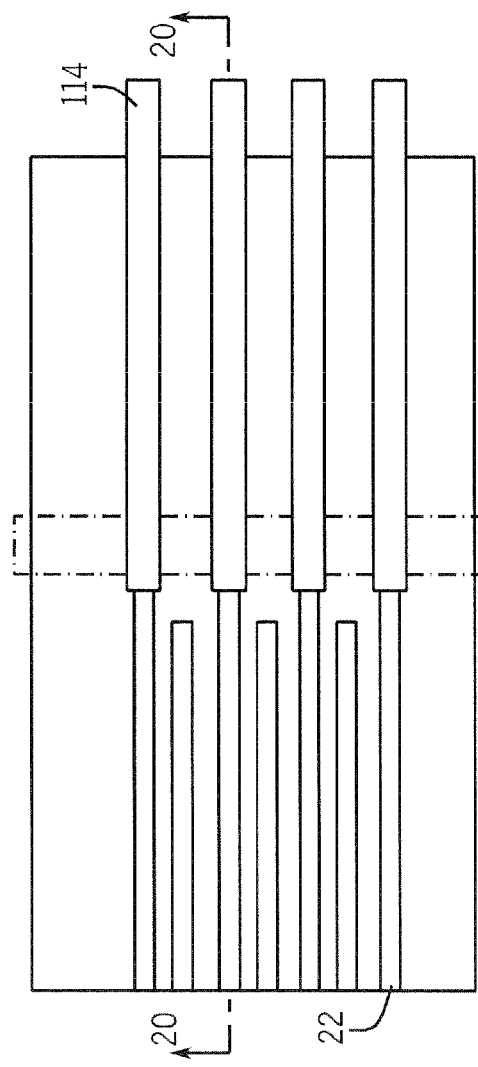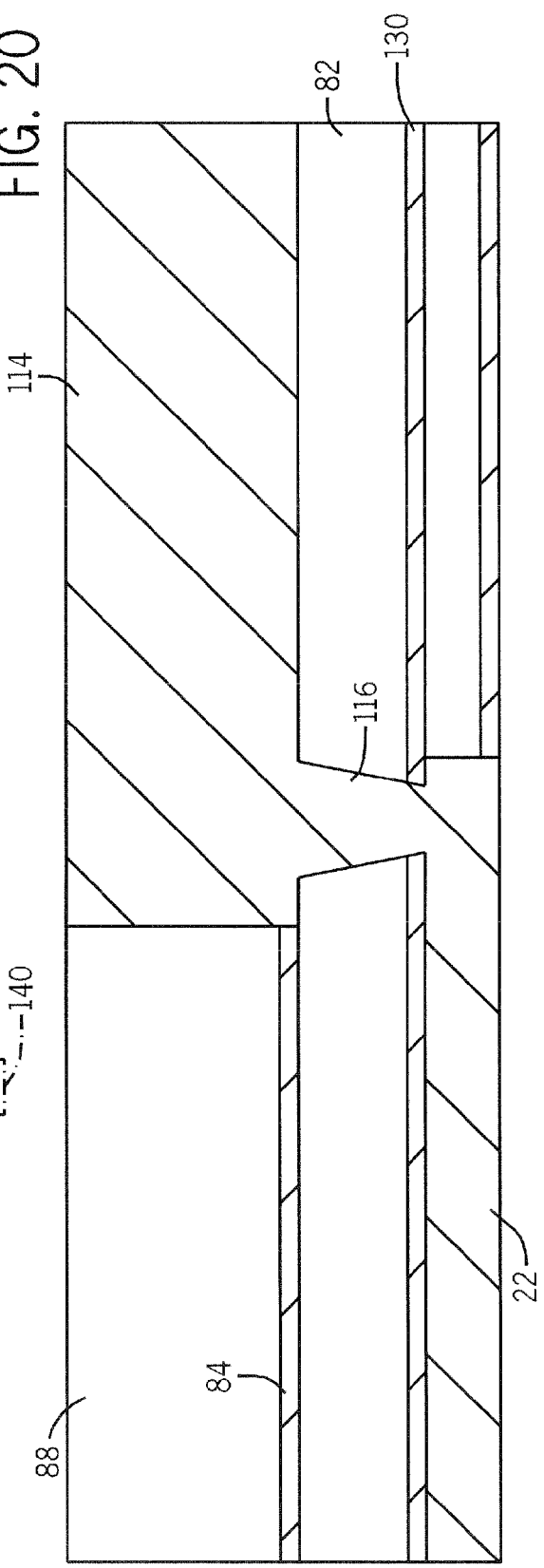

RESISTIVE RANDOM ACCESS MEMORY

BACKGROUND

This relates generally to resistive random access memories (ReRAMs).

A ReRAM relies on materials that can be electrically switched between a higher conductive state and a lower conductive state several times. One type of ReRAM, a phase change memory, uses phase change materials, i.e., materials that may be electrically switched between a generally amorphous and a generally crystalline state. One type of phase change memory element utilizes a phase change material that may be, in one application, electrically switched between a structural state of generally amorphous and generally crystalline local order or between different detectable states of local order across the entire spectrum between completely amorphous and completely crystalline states.

BRIEF DESCRIPTION OF THE DRAWINGS

FIG. 13 is a top plan view of the column decoder at a subsequent stage to that shown in FIG. 9 in accordance with one embodiment;

FIG. 14 is a cross-sectional view taken generally along the line 14-14 in FIG. 13;

FIG. 15 is a top plan view subsequent to what is shown in FIG. 13 in accordance with one embodiment;

FIG. 16 is a cross-sectional view taken generally along the line 16-16 in FIG. 15;

FIG. 19 is an enlarged, top plan view of the connections between the row lines and the row straps in the periphery in accordance with one embodiment;

FIG. 20 is an enlarged, cross-sectional view taken generally along the line 20-20 in FIG. 19;

DETAILED DESCRIPTION

Figure 1:
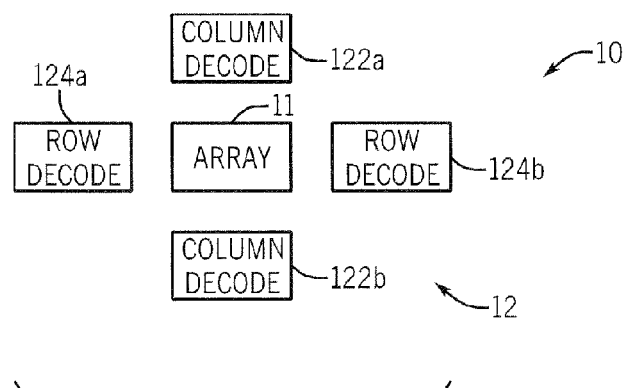
FIG. 1 is a schematic depiction of one embodiment of the present invention.

Referring to FIG. 1, a resistive random access memory 10 may include an array 11 and a periphery 12 surrounding the array. In accordance with some embodiments, on opposed sides of the array 11 are column decoders 122a and 122b. On opposed intermediate edges of the array 11 are row decoders 124a and 124b.

Figure 2:
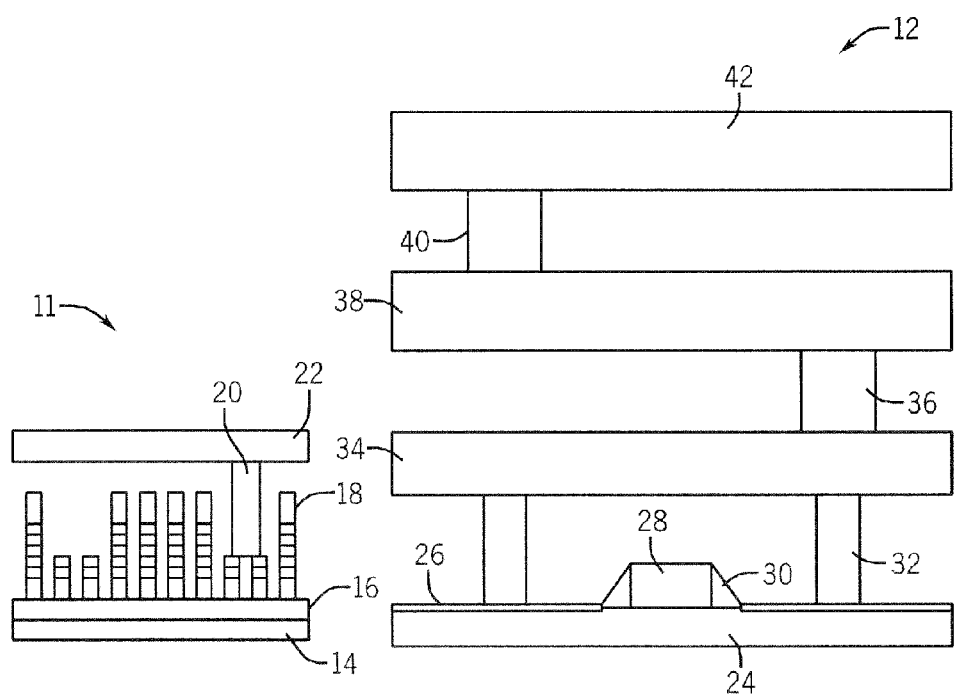
FIG. 2 is a partial, enlarged, cross-sectional view of one embodiment with the array on the left and the periphery on the right.

In accordance with some embodiments, the periphery 12 may use at least three metallization layers 34, 38, and 42, as shown in FIG. 2 on the right side. A semiconductor substrate 24 may include a transistor, for example, with a gate 28, sidewall spacers 30, and source and drain 26. A periphery contact 32 extends from the source and drain to the M1 metallization layer 34. A via 36 extends from the M1 metallization layer to the M2 metallization layer 38. A via 40 extends from the M2 metallization layer to the M3 metallization layer 42.

In the array 11 on the left in FIG. 2, a plurality of resistive random access memory cells may be formed. These cells can be one of a variety of resistive technologies that use resistance levels to indicate cell states.

In some embodiments, the array includes only two metal layers, one of which may correspond to the M1 metallization layer in the periphery 12. Specifically, the array 11 may include a metal row line 22 that is formed in the same deposition step that forms the periphery M1 metallization 34 in some embodiments. The metal row line 22 connects, by a contact via 20, to a bipolar junction transistor (not shown in FIG. 2) that operates as a select device to select a specific cell. The select device may be connected by row lines and bitlines to select one cell at the intersection of a selected row and a selected bitline or column. Each cell is connected to a bitline 18 that runs perpendicularly to the row lines 22, in some embodiments.

Figure 3:
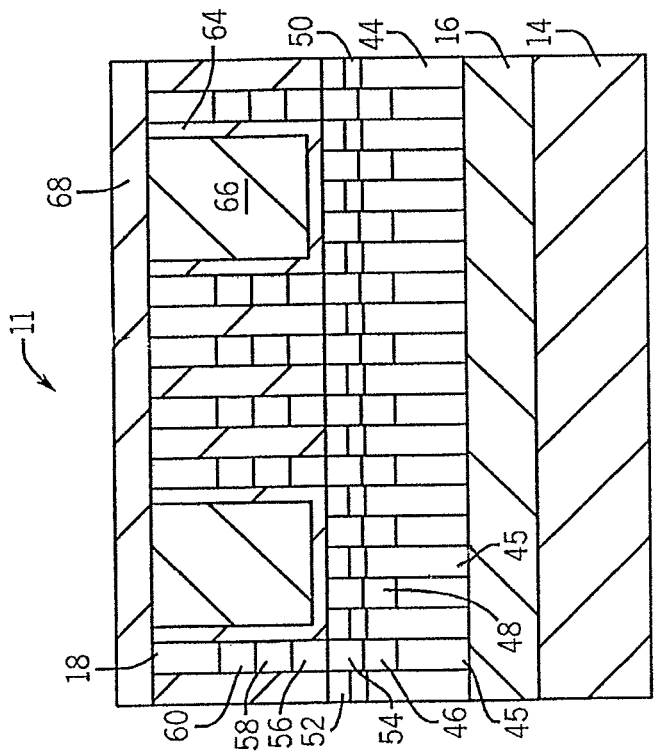
FIG. 3 is a more enlarged, cross-sectional view of the memory array at an early stage of manufacture in accordance with one embodiment.

Referring to FIG. 3, the array 11 may include a lower substrate layer 14. The layer 14 extends completely across the array and may be implanted with an N+ type dopant in one embodiment. Above the layer 14 may be a monocrystalline silicon active layer 16. The active layer 16 may not be doped in some embodiments. Formed in the active layer 16 are bipolar junction select transistors that select the individual memory cells in some embodiments.

Each cell is defined between adjacent spaced trench isolations 44 in some embodiments. Between each trench isolation 44 is monocrystalline silicon 45 overlaid by either an N+ doped region 46 or a P+ doped region 48 to form emitter and base contacts of bipolar select transistors in some embodiments. Over each of the regions 46 and 48 is a metal plug 54. In some embodiments, the metal plug may be tungsten. In a ReRAM using phase change memory elements, the metal plug 54 may act as a heater.

Overlying the metal plug 54 is the resistive active switching material 56. In a phase change memory application, the active switching material 56 may be a chalcogenide, such as germanium, antimony, and tellurium, sometimes called GST. Other active layers may also be used in non-phase change embodiments, including nickel oxide, titanium dioxide, silicon dioxide, or MnOx, to mention some examples.

The active switching material 56 is electrically connected to a cap 58 which, in one embodiment, may be doped polysilicon. The cap 58 may be coupled to a metal barrier layer 60. The barrier layer 60 may be tantalum, which may act as a barrier to diffusion of the metal from the metal columns or bitlines 18 into the active switch material 56 or elsewhere. In some embodiments, the bitlines or columns may be formed of copper.

The cells are formed in a dielectric stack that includes a nitride layer 50, a tetraethylorthosilicate (TEOS) layer 52, another nitride layer 64, another TEOS layer 66, and an upper silicon nitride layer 68 in one embodiment. Other dielectric materials may also be used.

Figure 4:
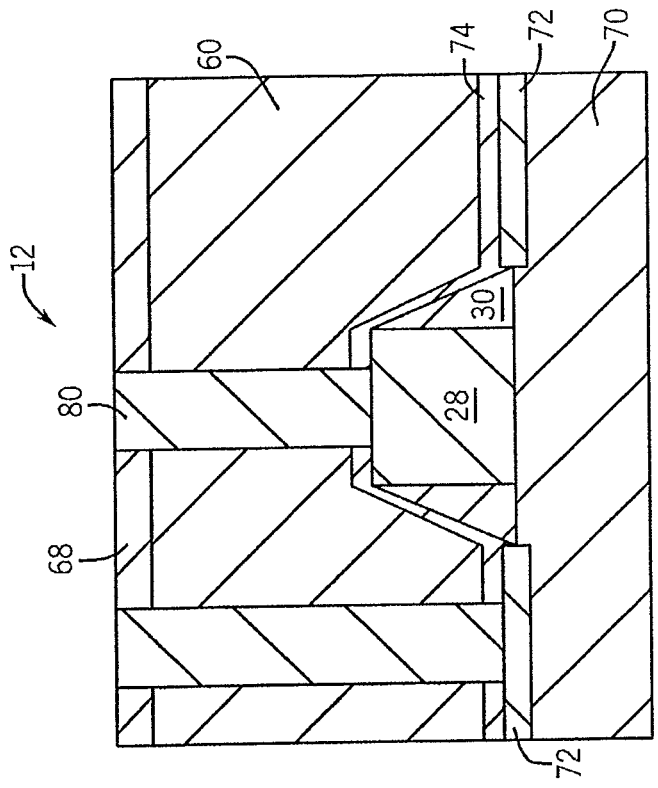
FIG. 4 is a more enlarged, cross-sectional view at the same stage as FIG. 3 showing the periphery in accordance with one embodiment.

At the stage shown in FIG. 3 for the array, the periphery, shown in FIG. 4, may include a conductive line (running in the row direction), which, in one embodiment, may be a silicide, such as cobalt silicide. A source and drain 72 may be formed by a suitable implant, such as an N+ implant into the polysilicon material that also forms the cobalt silicide conductive line 70 in one embodiment. A transistor may then include a gate electrode 28 which, in one embodiment, may be N+ doped polysilicon. The same material may be used for the cap 58 in the memory array 11 in some embodiments.

Sidewall spacers 30 may sandwich the gate electrode 28 and space the N+ implants that form the source and drain 72. The transistor is covered by a nitride layer 74 in some embodiments. While a single transistor is shown for illustration purposes, typically a large number of transistors may be formed in the periphery 12.

Overlying the transistor is the dielectric layer 60, such as TEOS, covered by the nitride dielectric layer 68. Peripheral contacts 80 extend through the dielectric layer 68 down to the drain and the gate 28 of the transistor.

Figure 5:
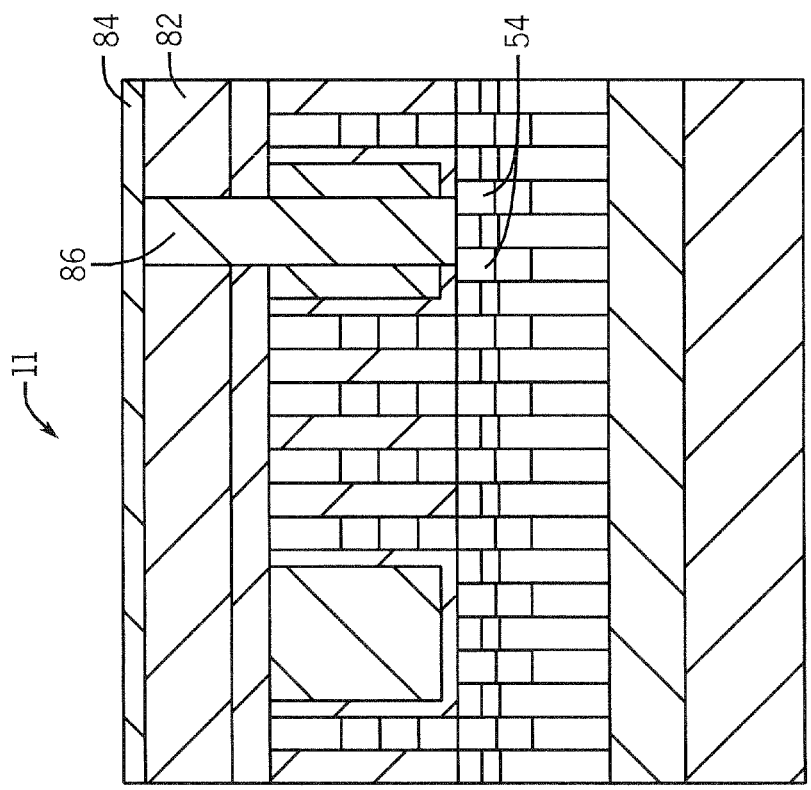
FIG. 5 is an enlarged, cross-sectional view of the array at a subsequent stage to that shown in FIG. 3 in accordance with one embodiment.

Moving now to FIG. 5, at this point, another dielectric layer 82, such as TEOS, has been deposited and covered by another nitride layer 84 over the array 11. A contact 86 has been formed down to two adjacent plugs 54 to make contact to the bipolar junction select transistors.

Figure 6:
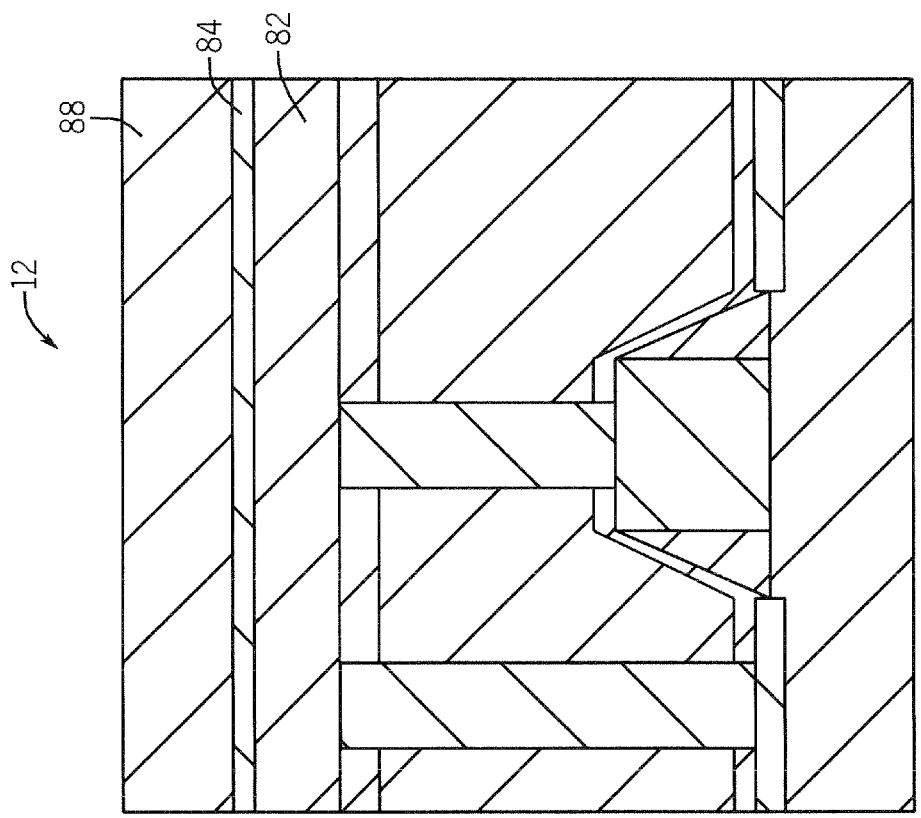
FIG. 6 is an enlarged, cross-sectional view of the periphery at the same stage as that shown in FIG. 5 in accordance with one embodiment.

At the same time, in the periphery 12, as shown in FIG. 6, an additional TEOS layer 88 is deposited. Over the array, strips of the layer 88, shown in FIG. 6, in the periphery are removed to create trenches for the subsequent deposition of the metal row lines.

Figure 8:
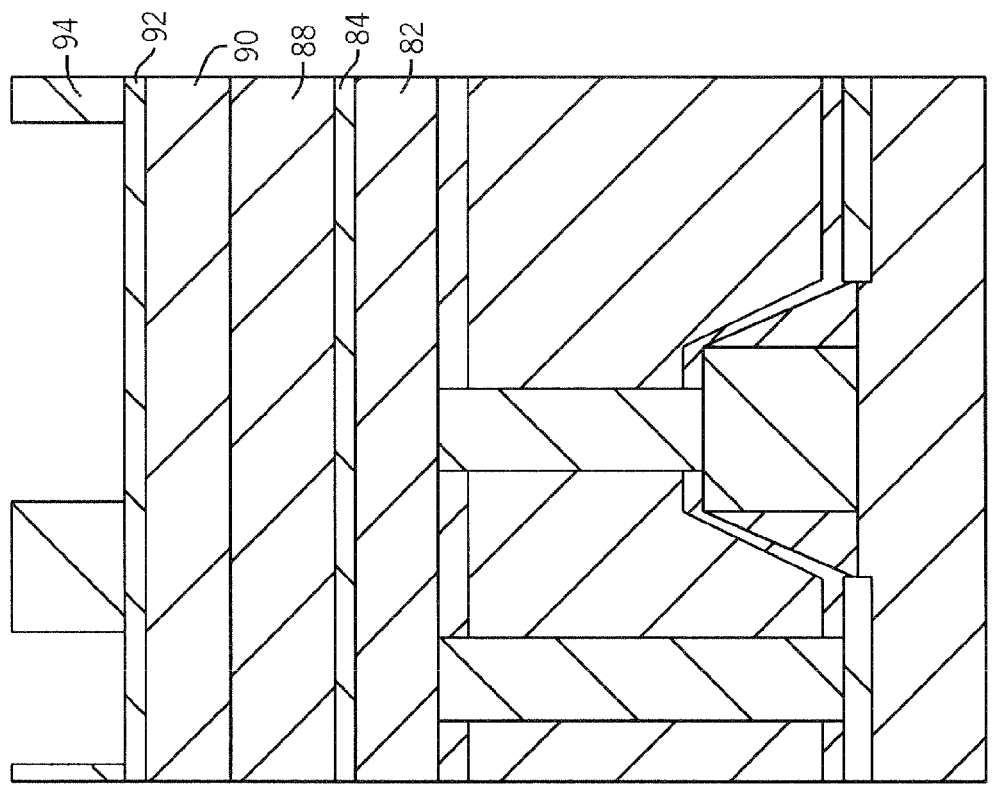
FIG. 8 is an enlarged, cross-sectional view of the periphery at the stage shown in FIG. 7 in accordance with one embodiment.
Figure 7:
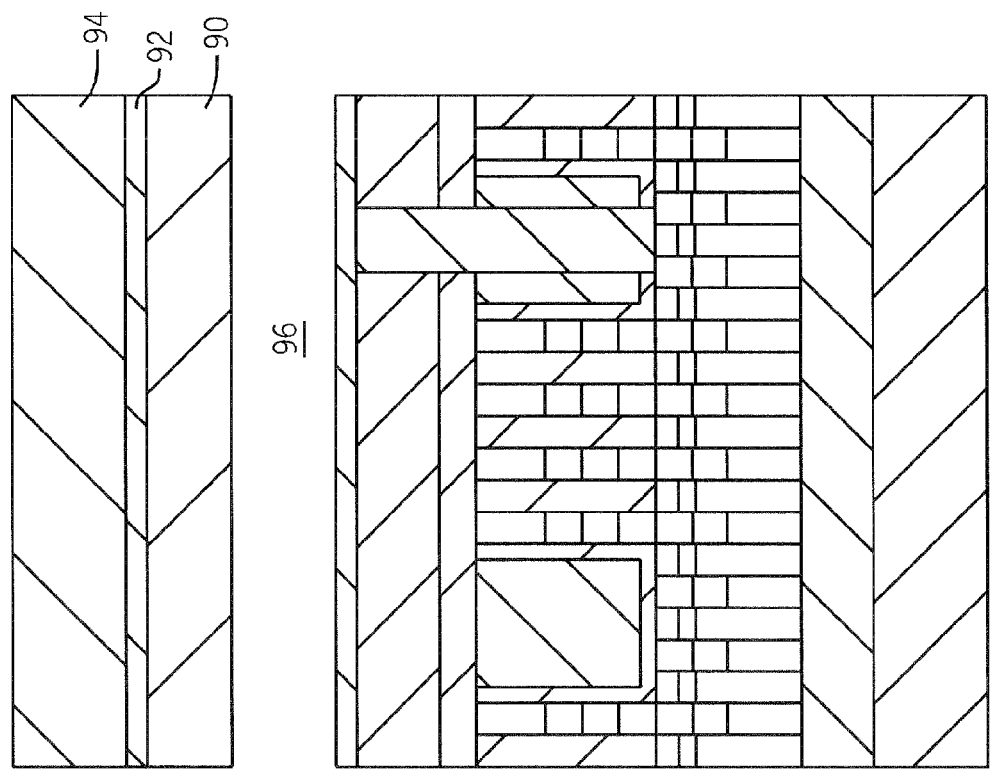
FIG. 7 is an enlarged, cross-sectional view at a subsequent stage of the array in accordance with one embodiment.

Proceeding to FIG. 7 for the array, overlying the gap 96 in the layer 82 for the metal row lines, may be an ashable hard mask (AHM) 90, covered by a nitrogen free antireflective layer (NFARL) 92, in some embodiments, in turn, covered by a photoresist layer 94. The photoresist layer 94 over the array is not patterned, but is patterned over the periphery, as shown in FIG. 8. Thus, the array is protected by the layer 94 while portions of the periphery are exposed to an ensuing etch.

Figure 9:
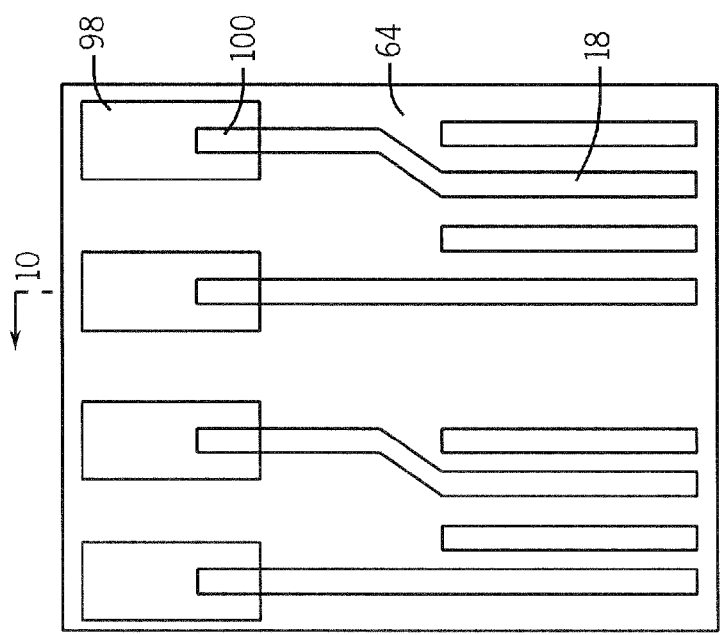
FIG. 9 is a top plan view showing the relationship between the column lines and the decoder straps in the periphery in accordance with one embodiment.
Figure 10:
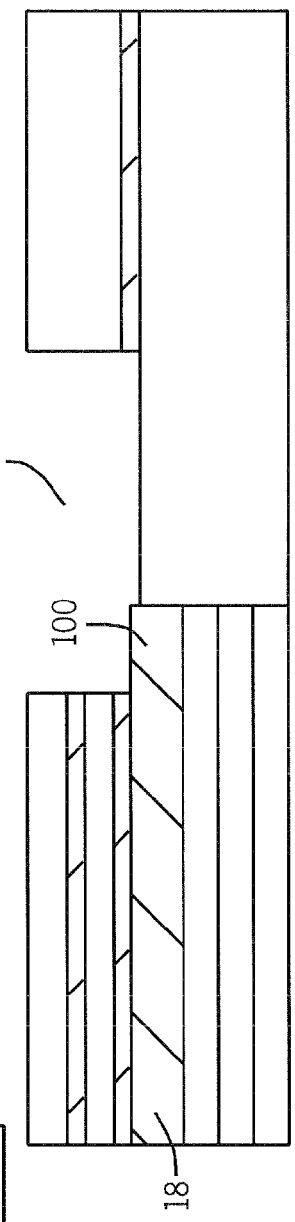
FIG. 10 is a cross-sectional view taken generally along the line 10-10 in FIG. 9.

Moving now to FIGS. 9 and 10, the connection between the column or bitlines 18 in the array and the column decoders 124 in the periphery 12 is depicted. Basically, openings 98 are formed in the dielectric material 64, as indicated in FIGS. 9 and 10. The metal column lines 18 are strapped to these openings. The column lines 18 extend into the page, as shown in FIG. 1.

Figure 11:
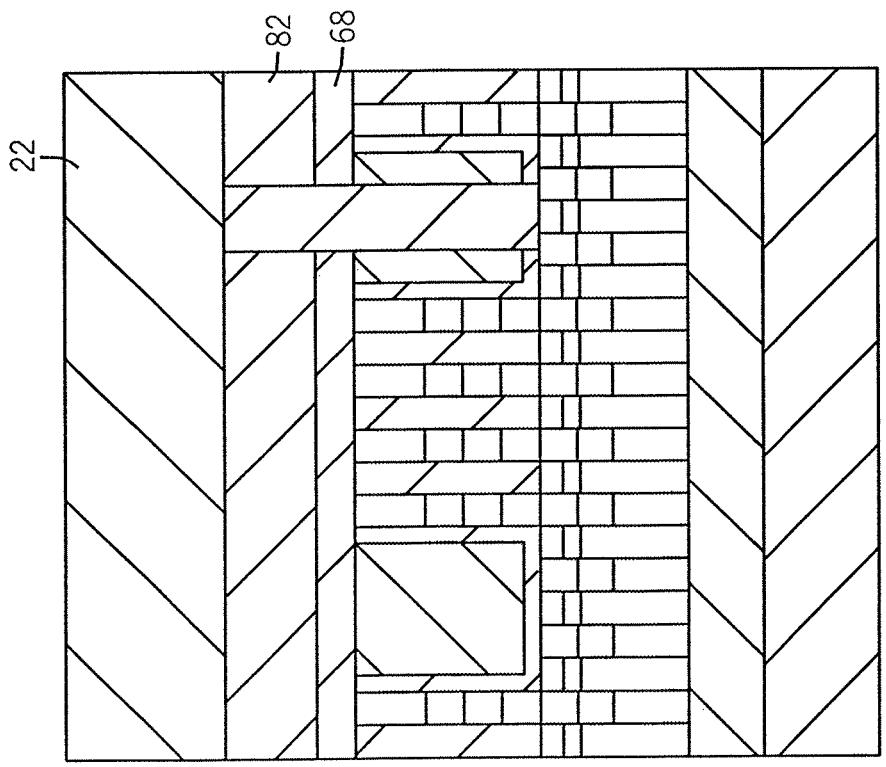
FIG. 11 is an enlarged, cross-sectional view of the array at a subsequent stage of that shown in FIG. 7 in accordance with one embodiment.

Referring to FIG. 11, at this point, the metal row lines 22 have been deposited in the gaps 96 and the layers 90, 92, and 94 have been removed. The metal row lines may be part of the M1 metallization, in some embodiments. In some embodiments, the metal row lines 22 may be formed primarily of copper with an initial thin barrier layer that may be formed of tantalum, followed by a copper seed layer, followed by copper deposition, for example, by electrochemical deposition, in turn, followed by copper chemical mechanical planarization.

Figure 12:
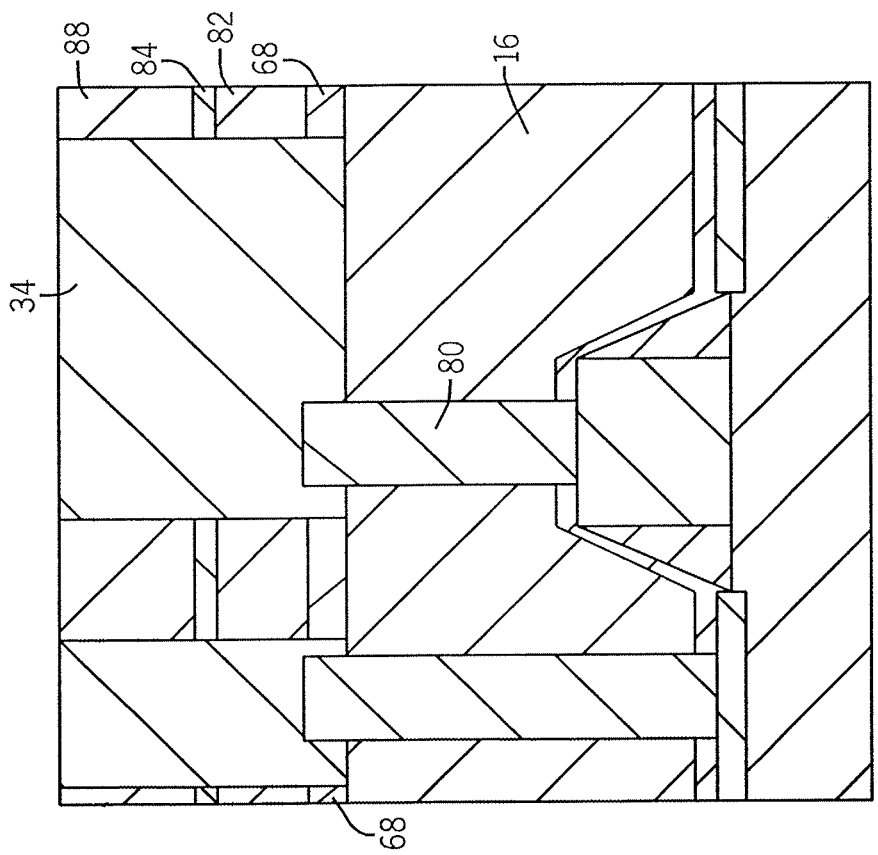
FIG. 12 is an enlarged, cross-sectional view of the periphery at the same stage shown in FIG. 11 in accordance with one embodiment.

FIG. 12 shows the M1 metallization 34 in the periphery, formed at the same time by the same deposition used to form the row lines 22 in the array. That is, the same deposition and planarization is used to form the row lines 22 in the array and the M1 metallization in the periphery. This, despite the fact that the row line 22 has a different thickness (and perhaps pitch) than the metallization 34 in the periphery. The metallization 34 in the periphery is deeper because trenches were formed all the way through the dielectric layer 82 and through the nitride layer 68 in the periphery, but not in the array.

One result of using the same metallization and planarizations to form the row lines 22 and the M1 metallization in the periphery is that the upper surface of the row lines 22 and the M1 metallization is substantially co-planar. Then the lower surfaces are not substantially co-planar so that the M1 metallization in the periphery can be thicker than the row lines in the array.

The metallization 34 in the periphery can be made thicker by forming trenches all the way through the layers 82 and 68 to make contact to the peripheral contacts 80. The same metal deposition and planarization steps can be used in the array and periphery, while achieving greater thickness in the periphery than in the array. This may be advantageous, in some embodiments, by reducing feature size in the array, while reducing resistance in the periphery.

The connection of the bitline to column decoder is shown in FIGS. 13-18. In FIGS. 13 and 14, a photoresist layer 94 is deposited and patterned with slot openings 105. Referring to FIG. 14, beneath the opening 105 in the photoresist layer, are the layers 82, 84, 88, 90, and 92 already described and a layer 130 which may be a nitride layer in some embodiments. At this point, the metallization 112 has been deposited and patterned in the opening 98 shown in FIG. 10. This provides a connection from the line 18. In addition, a hole 108 has been formed in the nitride dielectric 84.

The row lines 22 and bitlines 18 in the array are connected to the transistor decoders in the periphery 12. This connection could consist of a first via connecting row lines and bitlines to the M2 metallization in the periphery, a second via connecting M2 metallization in the periphery to the M1 metallization in the periphery and a periphery contact connecting M1 metallization in the periphery to the source drain 26 of a transistor. Even if the metal array pitch in the decoder regions is doubled, it remains relatively narrow. The M2 metallization in the periphery is typically built with the same pitch as the metal arrays that it has to strap.

Taking into account these layout boundary conditions, a dual damascene architecture built by conventional via first or line first process flow becomes very critical in terms of process control and cost. A via mask of high quality would be needed in order to define very narrow via holes. Via definition would require very critical specifications in terms of mask-to-mask registration and litho/etch critical dimension (CD) control in order to reduce metal/via shorting.

A dual damascene architecture that addresses these issues may be realized using a self-aligned approach in some embodiments. In this way, the via hole mask is replaced by a non-critical trench mask, reducing the cost of mask manufacturing and critical dimension (CD) and registration control requirements, in some embodiments. The via final CD in the critical direction (where the pattern is highly dense and metal/ via shorting is more likely) is not dependent on the via CD but only on the M2 metallization dimension. In this way metal/via shorts may be reduced or eliminated in some embodiments.

Figure 18:
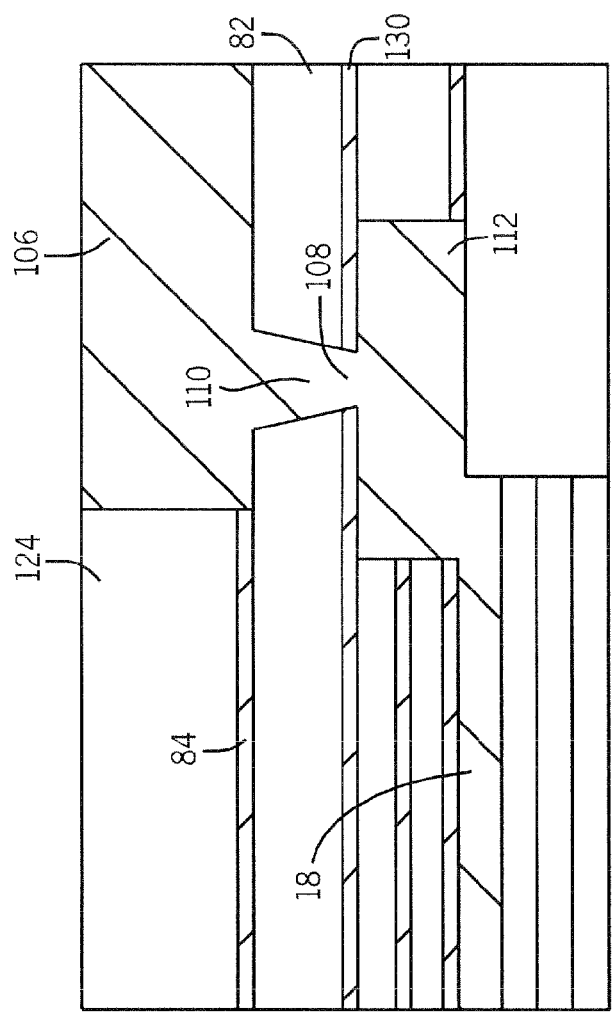
FIG. 18 is an enlarged, cross-sectional view taken generally along the line 18-18 in FIG. 17 in accordance with one embodiment.
Figure 17:
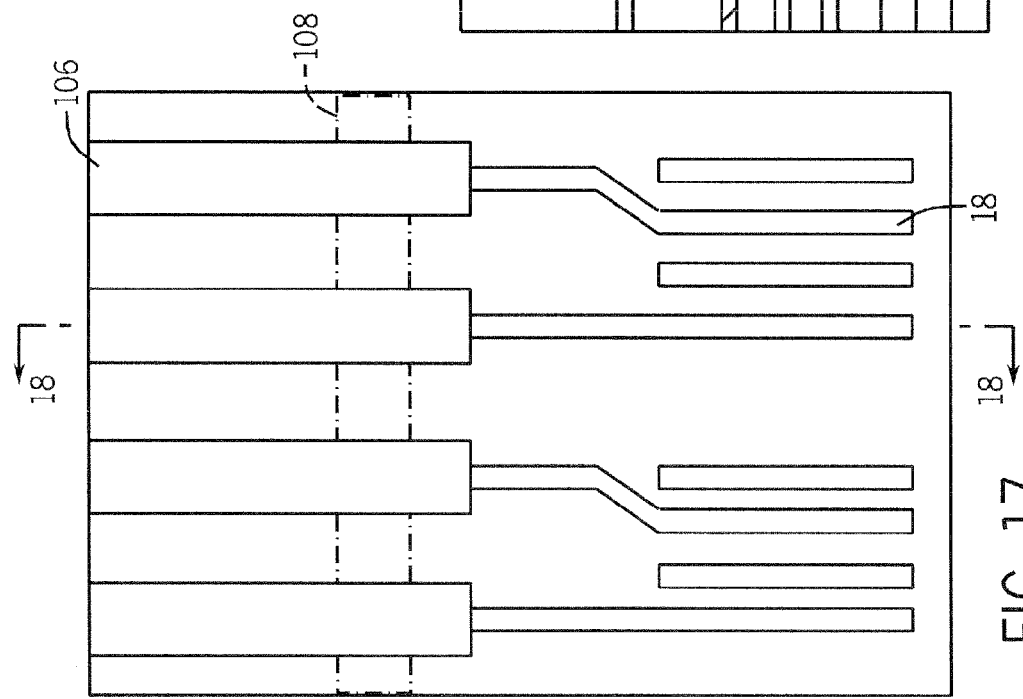
FIG. 17 is an enlarged, cross-sectional view of the column decoder at a subsequent stage to that shown in FIG. 9 in accordance with one embodiment.

Referring to FIGS. 17 and 18, the metallization 112 is coupled to another metallization 110, in turn, coupled to the metallization 106. The metallization 110 is formed using a mask, shown in dashed lines in FIG. 17. A first etch opens the hole 108 in the row direction (across all of the column lines 18) through nitride layer 84, as shown in FIG. 14. Then that hole 108 may be covered and filled by a TEOS layer 88.

Next, the perpendicularly (column direction) oriented etch photoresist mask 94 is used to etch the layers 82, 88 and 90, as shown in FIGS. 15 and 16. That perpendicularly (column direction) oriented mask exposes tapered slots 133 in the column 18 direction through the layer 82, shown in FIGS. 15 and 16 to enable etching through nitride layer 84, but confined to a strip or reduced width in the direction perpendicular to the lengths of the column lines 18.

The result is a dual damascene structure with lines 106 (column direction) and vias 110 (row direction), as shown in FIG. 15. This vertical pillar 110 connecting the metal 106 to the metal 112 is due to the use of two successively applied mask sets, one including parallel strips in one direction (to form holes 108) and the other including parallel strips in a perpendicular (column) direction (to form metallic connections 110 and 106). The alignment is achieved by the slot 108 formed through the nitride layer 84.

As a result, the decoders may be placed in the M2 metallization layer, instead of the M1 metallization layer, corresponding to the contact 112. This provides extra room for the decoders that would not otherwise be available.

At the same time, the rows may be formed in association with the M1 metallization layer, as indicated at 114, using a via 116. Basically the metallizations between the row decoders 124 and the row lines 22 are formed using the same techniques already described for the column decoder connections. Again, a column direction etch forms the trench 140, shown in FIG. 19. Thus, a plurality of row lines 22 may be exposed in one etch. That etch penetrates through the nitride layer 130. Thereafter, the layers 82, 84, and 88 may be deposited to fill in the trench. Then trenches are formed in the row direction to form the metal connection 116 and the column decoder line 114, as shown in FIG. 20.

Figure 22:
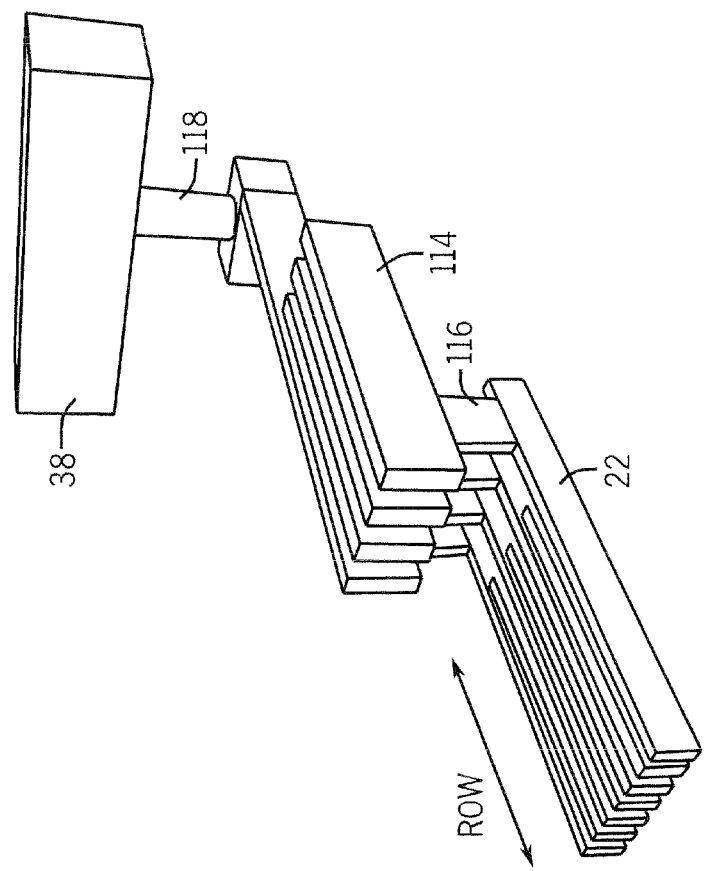
FIG. 22 is an enlarged, perspective view of the row decoder in accordance with one embodiment.
Figure 21:
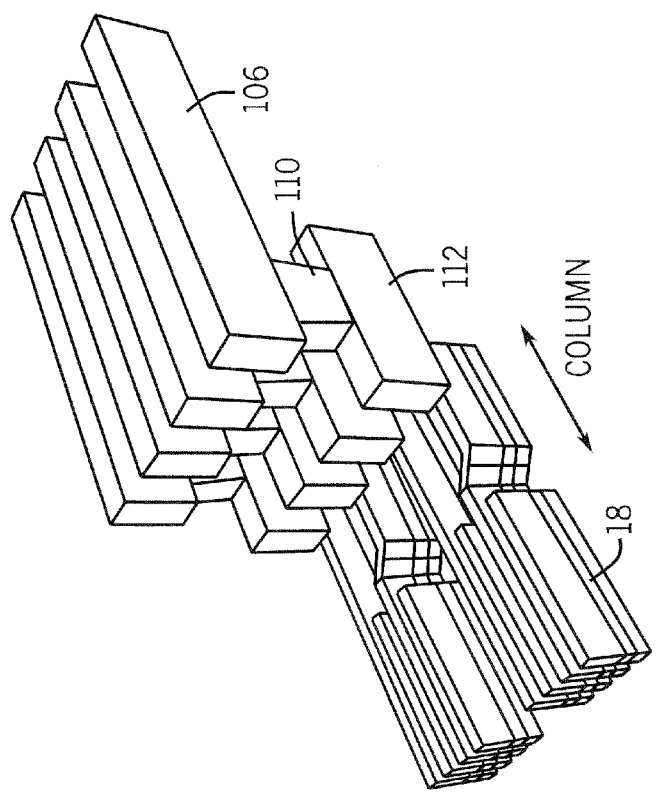
FIG. 21 is a perspective view of the column decoder in accordance with one embodiment.

The net result is shown in FIG. 21 for the column decoder and FIG. 22 for the row decoder. The columns 18 directly contact the plugs 112, which contact the M2 layer 106 through vias 110, in the case of the decoder. In the case of the row decoder, the rows 22 contact the M1 metallization layer 114 through vias 116, which contact the M2 metallization layer 38 through vias 118.

Programming to alter the state or phase of the material may be accomplished by applying voltage potentials to bottom and top electrodes, thereby generating a voltage potential across a memory element including a resistive switching material. Considering the case of phase change memories, when the voltage potential is greater than the threshold voltages of any select device and memory element, then an electrical current may flow through a heater and the switching material in response to the applied voltage potentials, and may result in heating of the switching material.

This heating may alter the memory state or phase of the switching material, in one phase change memory embodiment. Altering the phase or state of the material 16 may alter the electrical characteristic of memory material, e.g., the resistance or threshold voltage of the material may be altered by altering the phase of the memory material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
   a memory array including transverse row lines and bitlines, said row lines having an upper surface;
   a memory periphery associated with the memory array, said periphery including decoders electrically coupled to said transverse row lines and bitlines;
   a first dielectric over the memory array and the memory periphery;
   a second dielectric over the first dielectric, wherein the second dielectric is different from the first dielectric;
   a third dielectric over the second dielectric;
   a fourth dielectric over the third dielectric
   a first opening over the memory array through third and fourth dielectrics but not through the first and second dielectrics;
   a second opening over the memory periphery through the first, second, third, and fourth dielectrics;
   a metallization in the first and second openings and having an upper surface, wherein the upper surface of said metallization in the periphery being substantially co-planar with the upper surface of the metallization in the memory array, wherein said metallization having a first thickness in the first opening and further having a second thickness in the second opening, the second thickness greater than the first thickness;
   a first contact in the memory array, wherein the first contact extends from the first opening, through the first and second dielectrics and contacts two adjacent metal plugs below the first dielectric; and a second contact in the memory periphery, wherein the second contact extends from the second opening to a gate of a transistor.

2. The memory of claim 1 wherein the metallization is a first metallization, and the memory further comprises a second metallization in the periphery above the first metallization, said decoders are formed in said periphery in said second metallization.

3. The memory of claim 1 including said bitlines extending below said row lines.

4. The memory of claim 3, said bitlines being, coupled to column decoders by a pair of vertically spaced sets of parallel metallizations, one metallization for each bitline.

5. The memory of claim 4 wherein said vertically spaced sets of metallizations extend generally parallel to said bitlines and said sets are vertically separated by vertically extending vias, the lowermost of said metallizations being formed directly on said bitlines.

6. The memory of claim 3, said row lines being coupled to said decoders by a first set of parallel metallizations extending generally parallel to said row lines.

7. The memory of claim 6, said first set coupled to said row lines by vertically extending vias.

8. The memory of claim 7, said row lines being coupled to said decoders through said first set of metallizations via additional metallizations coupled to said first set of metallizations by a vertically extending via.

9. The memory of claim 1, further comprising:
a third contact formed over the memory periphery, wherein the third contact includes a portion exposed by a third opening through the first, second, third, and fourth dielectrics in the memory periphery.

\* \* \* \* \*

UNITED STATES PATENT AND TRADEMARK OFFICE
CERTIFICATE OF CORRECTION

| | | |
|---|---|---|
| PATENT NO. | : 8,860,223 B1 | Page 1 of 1 |
| APPLICATION NO. | : 12/836661 | |
| DATED | : October 14, 2014 | |
| INVENTOR(S) | : Cristina Casellato et al. | |

It is certified that error appears in the above-identified patent and that said Letters Patent is hereby corrected as shown below:

In the Claims

In column 7, line 11, in Claim 4, delete "being," and insert -- being --, therefor.

Signed and Sealed this
Twenty-third Day of December, 2014

Michelle K. Lee
*Deputy Director of the United States Patent and Trademark Office*